(12) United States Patent
Clifton

(10) Patent No.: US 12,244,274 B2
(45) Date of Patent: Mar. 4, 2025

(54) DEVICE, METHOD AND COMPUTER PROGRAM PRODUCT FOR AMPLIFICATION OF AN INPUT SIGNAL

(71) Applicant: SONY SEMICONDUCTOR SOLUTIONS CORPORATION, Atsugi (JP)

(72) Inventor: John Christopher Clifton, Basingstoke (GB)

(73) Assignee: SONY SEMICONDUCTOR SOLUTIONS CORPORATION, Atsugi (JP)

( * ) Notice: Subject to any disclaimer, the term of this patent is extended or adjusted under 35 U.S.C. 154(b) by 577 days.

(21) Appl. No.: 17/422,946

(22) PCT Filed: Feb. 14, 2020

(86) PCT No.: PCT/GB2020/050353
§ 371 (c)(1),
(2) Date: Jul. 14, 2021

(87) PCT Pub. No.: WO2020/169951
PCT Pub. Date: Aug. 27, 2020

(65) Prior Publication Data
US 2022/0131508 A1 Apr. 28, 2022

(30) Foreign Application Priority Data
Feb. 19, 2019 (GB) ........................ 1902264

(51) Int. Cl.
*H03F 3/24* (2006.01)
*H03F 1/56* (2006.01)
(52) U.S. Cl.
CPC ............... *H03F 3/245* (2013.01); *H03F 1/56* (2013.01); *H03F 2200/366* (2013.01); *H03F 2200/451* (2013.01)

(58) Field of Classification Search
CPC ...... H03F 3/245; H03F 1/56; H03F 2200/366; H03F 2200/451; H03F 2200/387;
(Continued)

(56) References Cited

U.S. PATENT DOCUMENTS 7,444,124 B1    10/2008 Loeb et al.
7,928,815 B2 *   4/2011 Shigematsu ............ H03F 3/604
                                                    333/32
(Continued)

FOREIGN PATENT DOCUMENTS

CN     1497838 A      5/2004
CN   101540589 A      9/2009
(Continued)

OTHER PUBLICATIONS

International Search Report issued on May 12, 2020 in PCT/GB2020/050353 filed on Feb. 14, 2020.
(Continued)

*Primary Examiner* — Andrea Lindgren Baltzell
*Assistant Examiner* — Khiem D Nguyen
(74) *Attorney, Agent, or Firm* — Oblon, McClelland, Maier & Neustadt, L.L.P.

(57) ABSTRACT

A device for amplification of an input signal, the device comprising: amplification circuitry comprising a plurality of switchable transistors; a variable voltage input connected to the amplification circuitry; and controller circuitry; wherein the controller circuitry is configured to: set a target output power level of the device; and control at least one of: a state of connection between the plurality of switchable transistors to change an effective physical dimension of the amplification circuitry; or a level of the variable voltage input; in accordance with a load impedance of an output of the amplification circuitry, to amplify the input signal to the target output power level for that load impedance.

15 Claims, 3 Drawing Sheets

(58) Field of Classification Search
CPC ..... H03F 2203/7209; H03F 2203/7236; H03F 1/42; H03F 3/72; H03F 1/0211; H03F 1/0277; H03F 3/189; H03F 2200/111; H03F 2203/21178; H04B 1/005; H04B 1/0483
USPC ........................................................ 330/291
See application file for complete search history.

(56) References Cited

U.S. PATENT DOCUMENTS

| | | |
|---|---|---|
| 8,253,485 B2 | 8/2012 | Clifton |
| 8,461,931 B1 | 6/2013 | Bayruns et al. |
| 2002/0175764 A1 | 11/2002 | Matsuura |
| 2005/0030094 A1 | 2/2005 | Conrad et al. |
| 2008/0290947 A1 | 11/2008 | Dawe |
| 2009/0295483 A1 | 12/2009 | Alidio et al. |
| 2011/0260797 A1 | 10/2011 | Lee |
| 2012/0313710 A1 | 12/2012 | Hull, Jr. |

FOREIGN PATENT DOCUMENTS

| | | |
|---|---|---|
| CN | 102104365 A | 6/2011 |
| CN | 102185566 A | 9/2011 |
| CN | 104753476 A | 7/2015 |
| CN | 105471395 A | 4/2016 |
| EP | 1156582 A2 | 11/2001 |

OTHER PUBLICATIONS

Kang et al., "A Multi-Mode Multi-Band Reconfigurable Power Amplifier for 2G/3G/4G Handset Applications", IEEE Microwave and Wireless Components Letters, vol. 25, No. 1, Jan. 2015, pp. 49-51.

* cited by examiner

DEVICE, METHOD AND COMPUTER PROGRAM PRODUCT FOR AMPLIFICATION OF AN INPUT SIGNAL

BACKGROUND

Field of the Disclosure

The present invention relates to a device, method and computer program product for Amplification of an Input Signal.

Description of the Related Art

The "background" description provided herein is for the purpose of generally presenting the context of the disclosure. Work of the presently named inventors, to the extent it is described in the background section, as well as aspects of the description which may not otherwise qualify as prior art at the time of filing, are neither expressly or impliedly admitted as prior art against the present invention.

In recent years, there has been significant increase in the number of telecommunication devices, such as portable telecommunication devices, being used for communications. These portable telecommunication devices are developed to communicate through radio frequency (RF) transmission systems. Owing to the increase in the number of portable telecommunication devices which are being used, there has been significant demand to increase the capacity of the communication networks through which the portable telecommunication devices communicate.

In order to address this demand, many communication systems and standards have been developed such as 3G, 4G and 5G communication standards or the like. The development of these standards is characterised by an increase in the number of frequency bands and modes which are being used for the RF communication. The development and implementation of these standards has led to an increase in capacity of communication networks. However, the characteristic increase in the number of frequency bands which are being used for the RF communication places several demands upon the devices which are configured to operate using these standards.

Transmission systems often comprise a power amplification device for amplification of the RF signals prior to transmission. However, power amplification devices are, in practice, often intrinsically narrow band. That is, efficient amplification is often provided only across a narrow frequency range of input signal. Accordingly, it is difficult to efficiently achieve the required amplification for the range of frequency bands which are used for the RF communication in modem transmission systems within a single power amplification device. This is particularly challenging since a transmission device, such as portable telecommunication device or the like, is often required to provide a degree of backward compatibility, and must be able to operate across the full range of frequency bands which may be used for RF communication.

Moreover, a number of the bands in 5G communication standards require even higher transmission power than previous standards, such as 4G or the like. This increase in power requirement further exacerbates the issue of providing sufficient amplification of the signals for transmission across the full range of operational frequencies and transmission power levels.

Currently, one power amplification device will typically cover one frequency band, or perhaps two or three frequency bands in the case that the frequency bands are close to each other in frequency. However, there are a total of over 30 3GPP bands for 4G and 5G defined in 3GPP TS 38.101 (public domain document) from lower than 600 MHz up to beyond 30 GHz. Moreover, the output powers for some of the new 5G NR (New Radio) bands such as N77/N78/79 in FRI (<6 GHz) in some cases allow for higher transmit power levels than for 4G operation. Already for 4G handset terminals, it is not untypical for one terminal to cover more than twelve 3GPP bands, this is likely to increase once 5G enabled handsets are released.

It should also be noted that the power amplification device on a 3G/4G/5G user equipment (UE) terminal is typically required to transmit over a wide range of transmit powers in accordance with how far the UE is from the base station terminal. Over the complete range of transmit powers, the power amplification device should operate with high efficiency in order to reduce battery drain and reduce temperature in the UE due to thermal dissipation resulting from poor power amplification device efficiency. Performance metrics which can be used to determine the overall performance and efficiency of a power amplification device include performance metrics such as DC to RF power as well as, in some cases, linearity, which may be specified in terms of the degree of distortion of the modulating signal and/or leakage of RF power into adjacent RF channels.

As such, it is a challenge to provide a power amplification device which is able to efficiently provide amplification across the full range of frequencies which are used by modern transmission systems.

It is an aim of the present disclosure to address these issues.

SUMMARY

According an embodiment of the disclosure, a device for amplification of an input signal is provided, the device comprising: amplification circuitry comprising a plurality of switchable transistors; a variable voltage input connected to the amplification circuitry; and controller circuitry; wherein the controller circuitry is configured to: set a target output power level of the device; and control at least one of: a state of connection between the plurality of switchable transistors to change an effective physical dimension of the amplification circuitry; or a level of the variable voltage input; in accordance with a load impedance of an output of the amplification circuitry, to amplify the input signal to the target output power level for that load impedance.

According to an embodiment of the disclosure, a method of controlling a device for amplification of an input signal comprising: amplification circuitry comprising a plurality of switchable transistors; a variable voltage input connected to the amplification circuitry; and controller circuitry is provided, the method comprising: setting a target output power level of the device; and controlling at least one of: a state of connection between the plurality of switchable transistors to change an effective physical dimension of the amplification circuitry; or a level of the variable voltage input; in accordance with a load impedance of an output of the amplification circuitry, to amplify the input signal to the target output power level for that load impedance.

According to an embodiment of the disclosure, a computer program comprising instructions which, when the program is executed by a computer, cause the computer to carry out a method of controlling a device for amplification of an input signal comprising: amplification circuitry comprising a plurality of switchable transistors; a variable voltage input connected to the amplification circuitry; and controller circuitry; is provided, the method comprising: setting a target output power level of the device; and controlling at least one of: a state of connection between the plurality of switchable transistors to change an effective physical dimension of the amplification circuitry; or a level of the variable voltage input; in accordance with a load impedance of an output of the amplification circuitry, to amplify the input signal to the target output power level for that load impedance.

According to the embodiments of the disclosure, a single power amplification device can be provided for amplification of an input signal which has a wide power bandwidth and is thus capable of efficient amplification of input signals across an increased range of frequencies. Moreover, since efficient amplification of the range of input signals across an increased frequency range can be provided using a single power amplification device, the cost and complexity of producing the transmission means is reduced.

Of course, it will be appreciated that the present disclosure is not limited to these effects, there may be others.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
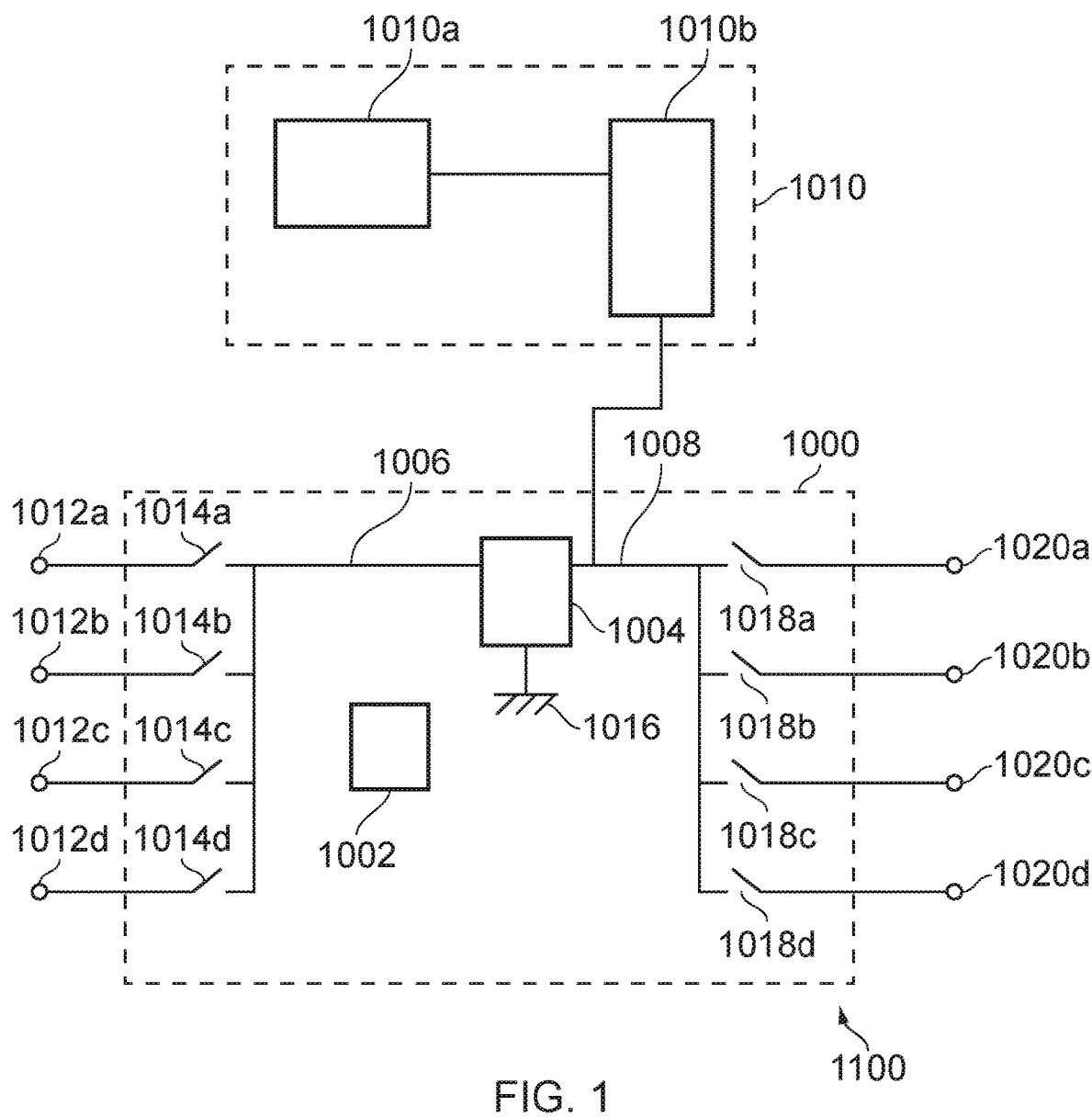
FIG. 1 shows a configuration of a transmission means including a device for amplification of an input signal according to an embodiment of the disclosure.

Referring now to the drawings, wherein like reference numerals designate identical or corresponding parts throughout the several views.

A device for amplification of an input signal according to embodiments of the disclosure may be applied to a transmission system for multi-band multi-mode transmission. Accordingly, embodiments of the disclosure will first be described with reference to this example situation. However, it will be appreciated that the present disclosure is not particularly limited to this specific example. Rather, a device for amplification of an input signal according to embodiments of the disclosure may be applied to other example situations and configurations as required.

FIG. 1 shows an example configuration of a transmission system 1100 including a device 1000 for amplification of an input signal according to embodiments of the disclosure. In this example situation, transmission system 1100 is a transmission system for multi-band multi-mode transmission, and comprises a device 1000 for amplification of the signal prior to transmission by the transmission system 1100. The transmission system illustrated with reference to FIG. 1 may be located on the user equipment side of a wireless communication network. However, the transmission system may, alternatively, be located on a base station side of the wireless communication network, for example.

Now, referring to FIG. 1, the device 1000 comprises amplification circuitry 1004.

In this example, the amplification circuitry 1004 of device 1000 is configured in order to provide amplification of an input signal prior to transmission by the transmission system 1100. The input signal, for which amplification is desired, is provided to the amplification circuitry 1004 through connection with an input section 1006. The amplified signal, after being amplified by the amplification circuitry 1004, is provided by the amplification circuitry 1004 to an output section 1008 of the device 1000. Furthermore, power is supplied to the amplification circuitry 1004 through a connection to a power supply 1010.

According to embodiments the disclosure, device 1000 comprises controller circuitry 1002 configured to control the operation of the device 1000. That is, the controller circuitry 1002 is communicatively coupled to the both the amplification circuitry 1004 and the power supply 1010 and is configured to control the operations of these elements of the device 1000 and transmission system 1100 as required.

Since, in this example, the device 1000 is being used in a multi-band multi-mode transmission system 1100, the input section 1006 is connected to a plurality of input terminals 1012a, 1012b, 1012c and 1012d. Each of the plurality of input terminals 1012 is configured to receive an input signal of a given input frequency for provision to the amplification circuitry 1004 for amplification prior to transmission by the transmission system 1100. That is, a first portion of the input terminals 1012 may be configured to receive signals of a frequency band used by a 4G communication standard, while a second portion of the input terminals 1012 may be configured to receive signals of a frequency band for 5G communication standard or the like. Alternatively, or in addition, at least a portion of the input terminals 1012 may be configured to receive signals of a frequency band for 3G communication, or input signals of a frequency band or mode used in 3GPP communication standards or WiFi communication standards in accordance with the situation to which the embodiment of the disclosure is applied.

It will be appreciated that while, in this specific example, four input terminals 1012 are shown, it will be appreciated that the present disclosure is not particularly limited in this regard. Rather, the number of input terminals required will depend upon the number of frequency modes and bands on which the transmission system 1100 is configured to operate.

The plurality of input terminals 1012 are selectively coupled to the input section 1006 of the device 1000. That is, in this example, the plurality of input terminals 1012 are connected to the input section 1006 of the device 1000 by a corresponding plurality of switches 1014a, 1014b, 1014c and 1014d. The plurality of switches 1014 are configured to selectively connect or disconnect the input section 1006 of the device 1000 from the corresponding input terminal 1012.

In certain examples, the plurality of switches 1014 may be controlled by the controller circuitry 1002 of the device 1000. Alternatively, the switches may be controlled by other processing circuitry associated with the transmission system 1100, for example. Furthermore, while a plurality of switches are shown in FIG. 1, the present disclosure is not particularly limited in this regard. That is, any switching section may be provided for connecting the plurality of input terminals 1012 with the input section 1006 as required in accordance with the situation to which embodiments of the disclosure are applied.

Now, in the example of FIG. 1, the switches 1014 are configured to connect and disconnect the plurality of input terminals 1012 from the input section 1006 of the device 1000 in accordance with an operation of the transmission system 1100. That is, when the transmission system 1100 is operating on a first frequency band associated with a first input terminal 1012a, the corresponding switch 1014a is configured to connect said first input terminal 1012a to the input section 1006. Then, if the transmission system begins operating on a second frequency mode or band associated with a second input terminal 1012b, the switch 1014a is configured to disconnect the first input terminal 1012a from the input section 1006. Subsequently, the switch 1014b is configured to connect the second input terminal 1012b to the input section 1006 of the amplification circuitry 1004. In this manner, input signals of a range of frequencies may be provided to the amplification circuitry 1004 for amplification.

Furthermore, in this example, the controller circuitry 1002 is configured to control the operation of the device 1000 in accordance with the input signal which is received, such that the amplification circuitry 1004 provides a level of amplification required to amplify the input signal to a target output power level. That is, the target output power level which is desired at the output section 1008 of the device 1000 may depend upon the frequency band of the input signal itself. In other words, signals of different radio frequencies may have different output power requirements. As such, the controller 1002 is configured to control the operation of the amplification circuitry 1004 such that the desired level of power output can be produced for the input signal which is received. The control of the amplification circuitry 1004 by the controller circuitry 1002 is described in more detail below.

As shown in FIG. 1, in this example, two outputs from the amplification circuitry 1004 are provided. In this example, the first output of the amplification circuitry 1004 is connected to ground 1016. The second output of the amplification circuitry 1004 is connected to both the power supply 1010 and the output section 1008 of the device 1000. In this manner, the power supply 1010 provides power to the amplification circuitry 1004 for amplification of the input signal. That is, power supply 1010 provides a bias or supply voltage to the amplification circuitry 1004 of device 1000.

In this example, the power supply 1010 of the transmission system 1100 comprises a DC power supply source 1010a and a variable output converter 1010b. In certain examples, where the transmission system is located in user equipment for example, the DC power supply source 1010a may comprise a battery located in the transmission system 1100. The DC power supply 1010a is operable to provide a DC power of a certain supply voltage. Typically, in user equipment for example, the DC power supply, such as a lithium ion battery or the like, may be operable to provide supply voltage of 3.5V, for example. As shown in FIG. 1, the DC power supply source 1010a is connected to the variable output converter 1010b. The variable output converter 1010b is itself connected to the amplification circuitry 1004 of the device 1000.

In this example, the variable output converter 1010b of the power supply 1010 is a DC to DC type converter capable of outputting a voltage of a magnitude either greater than or less than the input voltage magnitude received from the DC power supply source 1010a. It will be appreciated that the variable output converter 1010b is not particularly limited in this regard. However, in this example, the variable output converter 1010b may be a Buck-Boost converter or the like.

The variable output converter 1010b of the power supply 1010 is further controlled by the controller circuitry 1002. That is, the controller is configured to control the variable output converter 1010b of the power supply 1010 such that a desired supply voltage can be provided to the amplification circuitry 1004.

Consider a situation, such as shown in FIG. 1, whereby the device 1000 is implemented in a transmission system 1100 for multi-band multi-mode transmission. In this illustrative example, a signal of a first frequency may be received at the input terminal 1006. According to embodiments of the disclosure, the controller circuitry 1002 is configured to determine, for this input signal, the desired output signal power which is required at the output section 1008. That is, as noted above, in a multi-band multi-mode transmission means, the desired output power at the output section 1008 may depend upon the frequency band or mode of the input signal or distance of the UE terminal from the base station. The determination of the desired output signal power may be made by the controller circuitry 1002 in insolation or, alternatively, may be made by the controller circuitry 1002 through reference to a value or database stored in a memory of the device 1000 or transmission system 1100.

Once the desired output signal power has been determined by the controller circuitry 1002, the controller circuitry 1002 may instruct the power supply 1010 to provide the amplification circuitry 1004 with a certain supply voltage in order that the amplification circuitry 1004 may amplify the input signal to the desired output signal power.

The control of the power supply 1010 by the controller circuitry 1002 will be described in more detail below.

As such, according to embodiments of the disclosure, the specific operations of one or both of the power supply 1010 and the amplification circuitry 1004 are under the control of the controller circuitry 1002 such that a required level of amplification is provided to the input signal received at the input section 1006 in order to produce an output signal of the desired output power at the output section 1008.

Once the input signal has been amplified by the amplification circuitry 1004, the output signal of the amplification circuitry 1004 is provided to the output section 1008 of the device 1000.

The output section 1008 is connected to a plurality of switches 1018a, 1018b, 1018c and 1018d. The plurality of switches 1018 are configured to connect the output section 1008 to a corresponding plurality of output terminals 1020a, 1020b, 1020c and 1020d. It will be appreciated that the configuration of the plurality of outputs terminals 1020 is not particularly limited to the number or configuration of output terminals 1020 shown in FIG. 1. Rather, any number of output terminals 1020 may be provided in accordance with the number of frequency bands on which the transmission system 1100 is configured to operate. Typically, the number of output terminals 1020 will correspond to the number of input terminals 1012. Moreover, it will be appreciated that the operation of the plurality of switches 1018 may be controlled in the manner described above for control of the plurality of switches 1014 on the input side.

FIG. 1 therefore illustrates a example of a transmission system 1100 comprising a device 1000 for amplification of an input signal according to embodiments of the disclosure, whereby input signals from a range of frequency bands received at the input section 1006 may be amplified by amplification circuitry 1004, under the control of the controlling circuitry 1002, to provide an output signals of desired target output power at the output section 1008.

The operations of the amplification circuitry 1004 and power supply 1010 under the control of the controller circuitry 1002 of the device 1000 will now be explained in more detail with reference to FIGS. 2, 3 and 4 of the present disclosure.

Amplification Circuitry:

As described above, it is desirable that the amplification circuitry 1004 of the device 1000 has a wide power bandwidth, such that the amplification circuitry 1004 can provide efficient power amplification across the full frequency range of input signals which are input to the device 1000 for amplification, such as the range of frequencies used in a multi-band multi-mode transmission system 1100 as described with reference to FIG. 1 above.

The power bandwidth of a power amplification device 1004, that is, the frequency range over which the rated power output of the amplifier can be maintained, will be increased when the output impedance of the power amplification device is closer to the load impedance of that device. FIG. 2 shows the effect of impedance matching on power amplification bandwidth according to embodiments of the disclosure. That is, an illustration of a simulation of frequency against dB single pole impedance matching for a power amplification device 1000 with the load impedance is shown. In this example, the load impedance has a value of 50Ω. However, the present disclosure is not particularly limited in this regard. Rather, it is the degree of matching between the impedance of the power amplification circuitry 1004 and the load impedance which is required to provide the wider bandwidth.

Figure 2:
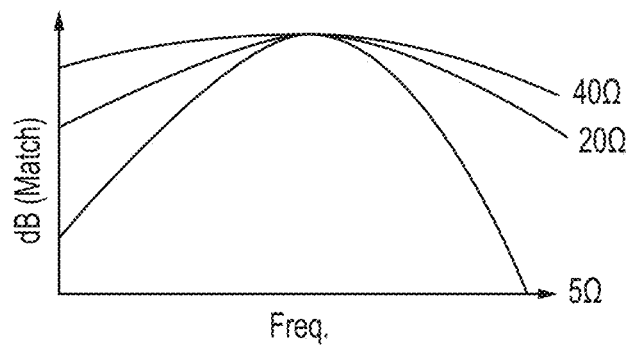
FIG. 2 shows the effect of impedance matching on power amplification bandwidth according to embodiments of the disclosure.
Figure 3:
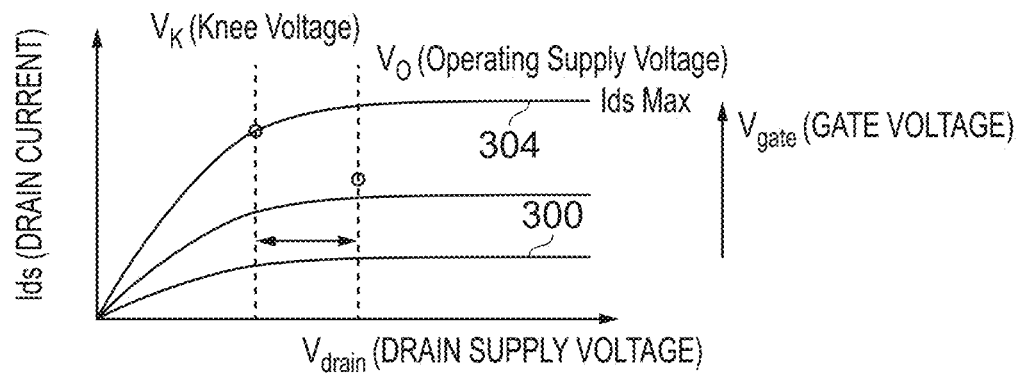
FIG. 3 shows an example of a current voltage curve for a field effect transistor according to embodiments of the disclosure.

Three simulations are shown in FIG. 2, whereby the output impedance of the power amplification of the power amplification device is matched to 5Ω, 20Ω and 40Ω respectively using single pole impedance matching which is typically deployed in UE power amplifiers in order to maintain size, high efficiency and reduced component costs.

As can be seen from the simulation illustrated with reference to FIG. 2, the bandwidth of the power amplification device becomes wider the closer the output impedance of the power amplification device is matched to the load impedance of 50Ω. That is, when the output impedance of the power amplification is 5Ω the bandwidth of the power amplification device is significantly narrower than the bandwidth of the power amplification device when the output impedance of the power amplification device is closer to the load impedance of 50Ω for example.

Accordingly, in order to increase the bandwidth of the amplification device 1004 and provide efficient amplification of the input signal, the output impedance of the power amplification device 1004 should be matched with, or brought closer to, the load impedance of the device 1000.

However, in a multi-mode multi-band transmission system as described with reference to FIG. 1 above, the target power output of the power amplification device 1004 may vary in accordance with the frequency of the input signal itself. That is, certain frequency bands may require that the transmission system uses a higher transmission power to transmit on those bands.

The inventors have realised that the physical dimensions of the power amplification device are uniquely constrained by the required load impedance the output power of the power amplification device. That is, the physical dimensions of the power amplification device must be specifically constructed in order to achieve the target output power $P_{out}$ into a load impedance $R_{load}$.

Consider, for example, a situation whereby the power amplification device is a transistor such as a field effect transistor. FIG. 3 shows an example of a current voltage curve for a field effect transistor according to embodiments of the disclosure. Specifically, a graph of drain to source voltage $V_{drain}$ against drain current $I_{DS}$ is shown. The maximum value of drain current $I_{max}$ is achieved when the gate to source voltage $V_{gate}$ has the highest value (depending upon whether the device is depletion or enhancement mode). That is, in FIG. 3, different simulations 300, 304 of $V_{drain}$ against $I_{DS}$ are shown. In the example of FIG. 3, the simulation 300 is at a lower $V_{gate}$ than the simulation 302. It will be appreciated that the knee voltage $V_k$ for the curve at maximum value of $V_{gate}$ can be used to calculate the voltage excursion of the transistor as $V_0-V_k$, wherein $V_0$ is the input supply voltage to the transistor (such as drain voltage in the case of a field effect transistor).

Accordingly, the maximum power output of the field effect transistor can be calculated using Equation 1:

$$P_{out(max)} = \frac{(V_0 - V_k)I_{dmax}}{4} \qquad \text{(Equation 1)}$$

wherein $P_{out(max)}$ is the maximum output power of the transistor.

However, the maximum current $I_{dmax}$ which a transistor can supply depends upon the physical dimensions of the transistor itself. For example, in the case of a field effect transistor, the maximum current the field effect transistor can supply is given by the equation:

$$I_{dmax} = KW_g \qquad \text{(Equation 2)}$$

wherein K is a constant with units A/mm and $W_g$ is the gate width of the transistor. Accordingly, the maximum current $I_{dmax}$ which can be achieved depends on the physical dimension, namely the gate width $W_g$, of the field effect transistor. Accordingly, given the relationship between power, current and resistance, the gate width can be shown to be governed by Equation 3:

$$W_g = \frac{2}{K}\sqrt{\frac{P_{out}}{R_{load}}} \qquad \text{(Equation 3)}$$

wherein, $P_{out}$ is the output power of the transistor and $R_{load}$ is the load impedance of the transistor. The load impedance is the impedance that results in the maximum output power for the device as calculated in Equation 1 of the present disclosure. Accordingly, the transistor dimension required to achieve a target output power into a given load impedance can be determined. In other words, for any given load impedance there is a single transistor dimension which can provide a target power output into that load resistance.

Of course, while illustrated here with reference to a field effect transistor, it will be appreciated that the above principles apply to other types of transistor (such as a heterojunction bipolar transistor or the like). Moreover, while illustrated here with reference to maximum output power, it will be appreciated that the above principles apply also to other types of situation, such as where power amplifier efficiency or linearity is targeted (rather than maximum output power).

Accordingly, since the impedance of the power amplifier is matched to the load impedance (to provide a wide power bandwidth) and the required output power varies in accordance with the input signal itself, there is a problem in how to provide a single power amplification device which can achieve a efficient amplification over a wide range of output powers and input frequencies.

Figure 4:
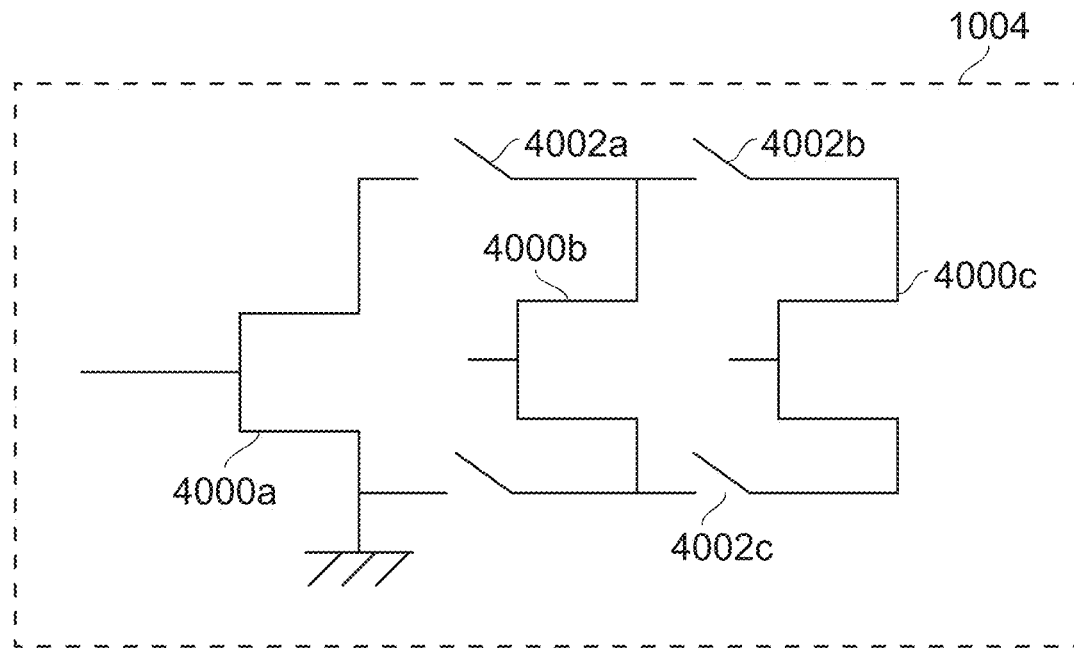
FIG. 4 shows an example of the internal configuration of amplification circuitry in accordance with embodiments of the disclosure.

FIG. 4 shows an example of the internal configuration of amplification circuitry 1004 in accordance with embodiments of the disclosure.

In this example, the amplification circuitry 1004 comprises a plurality of transistors 4000a, 4000b and 4000c switchably connectable through operation of a corresponding plurality of switches 4002a, 4002b and 4002c. That is, in this example, the plurality of transistors are arranged such that they may be switched in a parallel fashion in order to vary an effective physical dimension of the amplification circuitry 1004. The plurality of switches 4002a, 4002b and 4002c of the amplification circuitry 1004 are configured to be controllable by the controller circuitry 1002 of the device 1000 as described with reference to FIG. 1 above.

According to embodiments of the disclosure, the controller circuitry 1002 of the device 1000 is first configured to determine a target output power level of the device 1000. As described above, the target output power level may be determined in accordance with the frequency band of the input signal for example or the distance of the UE from the base station. Then, the controller 1002 is configured to control a state of connection between the plurality of switchable transistors 4000 of the amplification circuitry 1004 in order to change an effective physical dimension of the amplification circuitry 1004 in accordance with a load impedance of an output amplification circuitry 1004, in order that the amplification circuitry 1004 may efficiently amplify the input signal to the target output power level of for the load impedance.

Consider an example situation whereby the plurality of switchable transistors 4000 of the amplification circuitry 1004 comprise field effect transistors. In this example situation, the physical dimension of the amplification circuitry 1004 which may be varied by the controller circuitry 1002 will be the effective gate width of the amplification circuitry 1004. As such, the controller circuitry 1002 may be configured to determine the required effective gate width of the amplification circuitry 1004, through use of Equation 3 of the present disclosure, for example. Tat is, the controller circuitry 1002 can determine the effective gate width of the amplification circuitry 1004 which is required in order to efficiently produce the target power output into the load impedance of the device 1000, for a given input signal.

Once the effective gate width of the amplification circuitry 1004 has been determined, the controller circuitry 1002 is configured to operate the plurality of switches 4002 between the plurality of transistors 4000 in order to adaptively connect or disconnect transistors. In this example whereby the plurality of transistors 4000 comprise field effect transistors, increasing the number of transistors 4000 which are connected in parallel thus increases the effective gate width of the amplification device 1004.

That is, if the controller circuitry 1002 determines the effective gate width of the amplification device 1004 shown in FIG. 4 required to produce the output power is lower than the current effective gate width of the amplification circuitry 1004, the controller circuitry 1002 is configured to disconnect a portion of the plurality of transistors 4000. Thus, the effective gate width of the amplification circuitry 1004 will be decreased. In contrast, if the controller circuitry 1002 determines that the current effective gate width of the amplification circuitry 1004 is too low to produce the required output power, the controller circuitry 1002 is configured to control the switches to increase the number of transistors of the plurality of transistors 4000 which are connected in parallel.

As such, according to embodiments of the disclosure, effective physical dimension scalable amplification circuitry 1004 is provided, whereby the effective physical dimension of the amplification circuitry 1004 can be controlled by the controller circuitry 1002 in accordance with a power output requirement and the load resistance of the amplification circuitry 1004 or device 1000.

It will be appreciated that the amplification circuitry 1004 is not particularly limited to the specific example of the internal configuration illustrated with reference to FIG. 4. Rather, any internal configuration of amplification circuitry 1004 comprising a switchable plurality of transistors 4000 may be provided in accordance with embodiments of the disclosure. For example, any number of transistors 4000 may be provided within the amplification circuitry 1004, and the internal configuration of the amplification 1004 is not limited to the number of the transistors 4000 shown in FIG. 4. Moreover, the transistors 4000 may be arranged in any suitable configuration, such as connectable in series and or in parallel, in accordance with the requirements of the situation and the type of transistor used in the amplification circuitry 1004.

Furthermore, the plurality of transistors 4000 may be configured in a manner such that transistor 4000a is connectable to transistor 4000c independently of the state of connection of transistor 4000c, for example. Moreover, in this situation, the plurality of transistors may be non-uniform and may individually provide a range of physical dimensions (such as a range of gate widths for field effect transistors). That is, the physical dimension of transistor 4000a may be different to that of transistor 4000b and/or transistor 4000c. Providing non-uniform switchably connectable transistors in this manner further increases the number of internal configurations of the amplification circuitry 1004 and thus increases the range of effective gate widths of the amplification circuitry 1004 which can be adaptively provided by the device 1000 under the control of the controller circuitry 1002.

Variable Power Supply:

In addition to controlling the internal state of the amplification circuitry 1004 as described above, the controller circuitry 1002 of the device 1000 may be configured such that it is operable to control the DC voltage which is supplied to the amplification circuitry 1004 from the power supply 1010.

That is, it will be appreciated that the amplification circuitry 1004 requires a bias or supply voltage from the power supply 1010 in order to perform the required amplification of the input signal. However, the supply voltage which is required in order to provide the target power output depends upon load resistance into which the output power must be supplied. As such, the controller circuitry 1002 may be configured to vary the supply the voltage in accordance with the target power requirement and load resistance of the output of the device 1000.

As described with reference to FIG. 2 above, matching the output impedance of the amplification circuitry 1004 to the load impedance of the device 1000 increases the power bandwidth of the amplification circuitry 1004, thus improving the efficiency of the power amplification circuitry 1004. However, since the impedance of the power amplifier thus remains constant, a higher target output power of the amplification circuitry (when operating on a frequency band requiring a higher power output, for example) requires a higher level of supply voltage to be provided to the amplification circuitry 1004.

Consider an example whereby the plurality of transistors of the amplification circuitry 1004 comprise field effect transistors. The voltage is governed by the equation:

$$V=IR \quad \text{(Equation 4)}$$

wherein V is the voltage, I is the current and R is the resistance. Using the voltage excursion of the transistor and the definition of max current provided by Equation 2 of the present disclosure, the required operating supply voltage can be determined as:

$$V_0 = V_k + KW_g R_{load} \quad \text{(Equation 5)}$$

wherein $V_0$ is the operating supply voltage, $V_k$ is the knee voltage, K is a constant in units A/mm, $W_g$ is the effective gate width and $R_{load}$ is the load impedance of the amplification circuitry 1004.

Of course, while illustrated here with reference to a field effect transistor, it will be appreciated that the above principles apply to other types of transistor (such as a heterojunction bipolar transistor or the like) which may be used with the amplification circuitry 1004 of the device 1000 in accordance with embodiments of the disclosure.

Accordingly, the controller circuitry 1002 of device 1000 is able to determine the supply voltage required to provide the target power output into a load impedance $R_{load}$ given the effective physical dimension, such as the gate width $W_g$, of the amplification circuitry 1004.

Consider an example situation, whereby, based on the effective physical dimension of the amplification circuitry 1004 and the load resistance of the output device, the controller circuitry 1002 determines that a higher target power output is required. In this case, the controller may be configured to determine that the supply voltage must be increased. In the example transmission system 1100 described with reference to FIG. 1 above, the controller may thus inform the variable output converter 1010b to increase the level of the supply voltage from the DC power supply source 1010a.

Receiving the higher level of supply voltage enables the amplification circuitry 1004 to produce the target power output for the input signal. The amplified signal is then passed to the output section 1008 of the device for subsequent transmission by the transmission system 1100.

Alternatively, consider an example whereby the controller circuitry 1002 determines that the supply voltage being received by the amplification circuitry 1004 is too high for the target power output. Setting the supply voltage too high decreases the efficiency of the amplification circuitry 1004 and device 1000. In this case, the controller circuitry 1002 is configured to control the power supply 1010, in particular, the variable output converter 1010b, in order to decrease the supply voltage being supplied by the power supply 1010 to the amplification circuitry 1014. Accordingly, an appropriate level of power may be received by the amplification circuitry 1004 for amplification of the input signal.

As such, according to embodiments of the disclosure, a scalable voltage source is provided which can provided an increased or decreased level of supply voltage to the amplification circuitry 1004 under the control of the controller circuitry 1002, in order to provide sufficient power to the amplification circuitry 1004 to amplify the input signal to the target output power level into the load impedance for a wide range of frequencies of input signals.

Technical Effect:

The device 1000 described with reference to FIG. 1 of present disclosure is thus able to provide an efficient and appropriate level of amplification across the wide range of frequencies for which amplification is required. Furthermore, said amplification can be provided by a single amplification device 1004, comprising a plurality of switchably connectable transistors. In other words, a single voltage scalable and physical dimension scalable amplification circuitry 1004 may be used in order to efficiently provide the desired amplification level for any frequency band or frequency mode of operation.

Moreover, since efficient amplification across a wide frequency range can be provided using a single power amplification circuitry 1004, the cost and complexity of producing the device 1000 for amplification of an input signal is reduced.

Of course, it will be appreciated that the present disclosure is not particularly limited to these advantageous technical effects, there may be others.

Additional Modifications:

In addition to the example configuration described with reference to FIG. 1, the device 1000 according to embodiments of the disclosure may also be provided in the following arrangements.

According to embodiments of the disclosure, the effective physical dimension of the power amplification circuitry 1004 may be adjusted during operation of the device 1000 through switching of a plurality of connectable transistors 4000. One such type of transistor which may be used according to embodiments of the disclosure is, as described above, a field effect transistor. However, it will be appreciated that the present disclosure is not particularly limited in this regard. Rather, the types and ranges of transistors or amplification devices used in the amplification circuitry may depend upon the specific circumstances and situations to which embodiments of the disclosure are being applied.

Consider the example whereby the device 1000 is applied to a transmission system such as the transmission system 1100 described with reference to FIG. 1 of the present disclosure. As noted above, different frequency bands, and different modes of transmission, used by the transmission system may have different output power requirements which must be met by the device 1000. In particular, certain modes and bands for a communication system such as 5G or the like may have particularly high output power requirements. Of course, it will be appreciate that high power output requirements demand a correspondingly high bias or supply voltage be supplied to the amplification circuitry 1004.

In these situations, where a higher supply voltage is required, a semiconductor process which can support the high supply voltages may be used in accordance with embodiments of the disclosure. A field effect transistor employing III-V materials, such Gallium Nitride (GaN) or Gallium Arsenide (GaAs), or the like, may be particularly advantageous in these situations. Use of a field effect transistor employing III-V materials such as GaN may permit operation at supply voltages such as 5 to 20 volts. It will be appreciated that the supply voltage is not particularly limited to this range however, and supply voltages below, or indeed in excess, of this range may be used in accordance with embodiments of the disclosure.

Alternatively, the amplification circuitry 1004 of the present disclosure may comprise a plurality of junction pseudomorphic high electron-mobility transistors (JPHEMTs), PHEMTs or the like. Alternatively, Metal Oxide Semiconductor Field Effect Transistors may be used in accordance with embodiments of the disclosure. Indeed, any plurality of switchable transistors or power amplification devices may be used in accordance with embodiments of the disclosure. For example, Bipolar Junction Transistors, such as heterojunction bipolar transistors, may be used in accordance with embodiments of the disclosure as required.

That is, as noted above, the choice of the plurality of transistors which are used in the amplification circuitry 1004 will depend upon the situation to which the embodiments of the disclosure are applied, and is not particularly limited in this regard.

In the example described with reference to FIG. 1 above, a plurality of input and output terminals are provided in the transmission system 1110. These input and output terminals may be configured to perform input and output on a plurality of frequency bands and modes. According to embodiments of the disclosure, these input and output terminals are switchably connectable to the input and output sections of the amplification circuitry 1004. Furthermore, according to embodiments of the disclosure, a plurality of band specific incremental input matching devices may be provided between the plurality of input terminals 1012 of the transmission system 1100 and the input section 1006 of the amplification circuitry 1004 of the device 1000. Furthermore, according to embodiments of the disclosure, a plurality of band specific incremental matching and filtering devices may be provided between the output section 1008 of the amplification circuitry 1004 and the output terminals 1020 of the transmission system 1100.

Moreover, while the plurality of input and output terminals are shown as being part of the transmission system 1100 in FIG. 1, it will be appreciated that the present disclosure is not particularly limited in this regard. That is, according to embodiments of the disclosure, at least one of either the plurality of input terminals and/or the plurality of output terminals may be provided within the device 1000 itself.

Furthermore, since the power amplification can be provided by a single power amplification device 1004, according to embodiments of the disclosure, the entire device 1000 may be formed on a single integrated circuit chip. This is particularly advantageous since the physical distances between the power amplification circuitry and the corresponding switches can be kept very low. Reducing the physical distances between the components of the device 1000 in this manner reduces the changes in impedance between the components, thus further improving the efficiency of the device 1000.

It will be appreciated that, while in FIG. 1, a single amplification circuitry 1004 is provided in the device 1000, the present disclosure is not particularly limited in this regard. Tat is, a plurality of amplification means 1004 may be provided within a device 1000 in accordance with the situation to which the embodiments of the disclosure are being applied. For example, in a transmission system whereby transmission is performed on a plurality of frequency bands simultaneously, such as a Multiple-Input Multiple-Output (MIMO) transmission system or Carrier Aggregation (CA) transmission systems or the like, it may be particularly advantageous to provide a plurality of amplification circuitry 1004 such that amplification can be provided on a plurality of frequency bands simultaneously.

In this situation, it will be appreciated that each of the individual amplification circuitry 1004 may be comprise a plurality of switchably connectable transistors 4000 as described above with reference to FIG. 4 of the present disclosure, such that an effective physical dimension of each amplification circuitry 1004 may be individually changed by the controller circuitry 1002 in accordance with the specific frequency band which that amplification circuitry 1004 is required to perform amplification on at a given instance of time.

Even in this a transmission means whereby transmission is performed on a plurality of frequency bands simultaneously, the number of individual power amplification circuitries 1004 which are required may be reduced compared to known power amplification circuitries. That is, since each individual amplification circuitry 1004 may perform efficient amplification of the input signal across the range of frequency bands, a reduced number of amplification means, equal to the number of frequency bands upon which simultaneous transmission is required to be performed, may be provided.

Furthermore, while the above example has been described with reference to a multi-band multi-mode transmission system, it will be appreciated that the teachings of the present disclosure may be applied more generally to any system which requires amplification of an input signal, or input signals across a range of input frequencies. For example, embodiments of the disclosure may be applied to communication and transmission systems within a networked system such as the Internet of Tings or the like. Moreover, while the above has been described primarily with reference to a user equipment side of transmission, a device 1000 according to embodiments of the disclosure may be applied more generally to a base station side of the communication system or the like.

Furthermore, according to embodiments of the disclosure, the controller 1002 may be configured to perform scaling of the supply voltage independently of scaling of the effective physical dimension of the amplification circuitry or visa versa. For example, in a situation whereby the current effective physical dimension of the amplification circuitry 1004 is sufficiently close to the required effective physical dimension determined by the controller circuitry 1002 for example, the controller circuitry may be configured to perform control only of the input supply voltage provided by the power supply 1010. In other words, where the discrepancy between the impedance of the power amplification means and the load impedance is sufficiently small, effective amplification of the input signal to the target output transmission power in accordance with the load resistance may be performed by performing adjustment of the supply voltage alone.

Alternatively, in certain situations, such as whereby the supply voltage being supplied to the amplification circuitry 1004 is sufficiently close to the required supply voltage determined by the controller circuitry 1002 for example, effective amplification of the input signal to the target output transmission power in accordance with the load resistance may be performed by performing adjustment of the effective physical dimension of the amplification circuitry 1004 alone.

Selectively performing the adjustment of the effective physical dimension of the amplification circuitry 1004, and likewise, selectively performing the adjustment of the input supply voltage from the power supply 1010, in this manner further improves the efficiency of the operation of the amplification circuitry 1004 and device 1000.

A variable output converter 1010*b*, such as a Buck-Boost converter or the like, may be used in accordance with embodiments of the disclosure to increase or decrease the DC bias voltage being supplied to the amplification circuitry 1004 of the device 1000. As noted above, certain types of semiconductor material may be particularly suited to higher supply voltages. However, the voltage applied across an individual semiconductor device is limited by the physical material properties of the semiconductor, as high voltages can cause breakdown of the semiconductor material.

In situations whereby the level of the supply voltage exceeds the maximum supply voltage of the semiconductor material of the plurality of transistors or amplification devices provided in the amplification circuitry, or indeed exceeds the maximum available supply voltage from the variable voltage supply source or output converter, the architecture of the amplification circuitry 1004 may be constructed such that the required bias voltage across the amplification circuitry 1004 can be achieved while maintaining the voltage across each individual transistor within the maximum supply voltage of the semiconductor material or the maximum available supply voltage from the variable voltage supply source or output converter. For example, providing a series stack of transistors, such as field effect transistors, switchably connectable in parallel for a DC connection (or in series for RF) within the amplification circuitry in accordance with embodiments of the disclosure, enables the controller to control the effective physical dimension of the amplification circuitry while enabling higher supply voltages to be provided to the amplification circuitry, since a reduced DC supply voltage may be applied across each of the transistors within the series stack.

In addition to the above described example configurations, more generally, according to embodiments of the disclosure, a device, method and computer program product for amplification of an input signal may be provided as described in detail below with reference to FIGS. 5 and 6 of the present disclosure.

Figure 5:
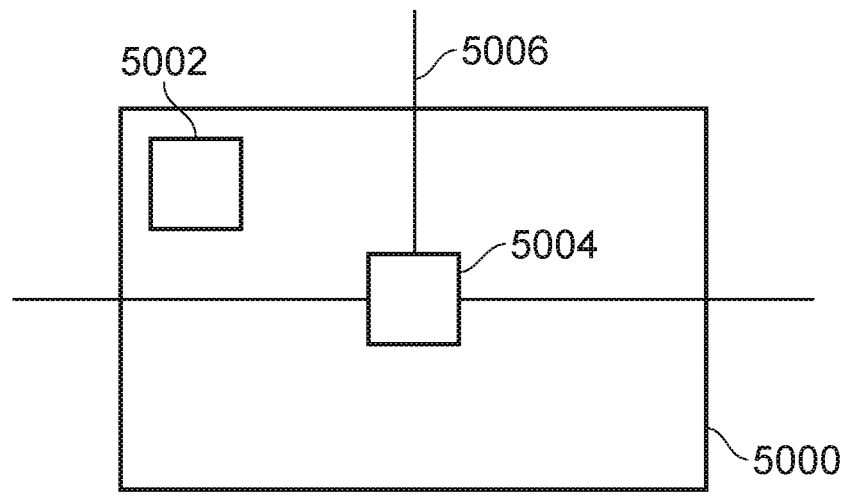
FIG. 5 shows a device for amplification of an input signal in accordance with embodiments of the disclosure.

Device for Amplification of Input Signal:

FIG. 5 shows a device for amplification of an input signal in accordance with embodiments of the disclosure. The device 5000 is a device, such as device 1000, for amplification of input signals. Device 5000 comprises amplification circuitry 5004, control circuitry 5002 and a variable voltage input 5006 connected to the amplification circuitry. Controller circuitry 5002 may be a microprocessor or other type of processing circuitry. For the specific situation whereby the device 5000 is implemented in a UE or the like, the controller 5002 may comprise at least a portion of a baseband LSI which exists in the UE, for example. In certain examples, controller circuitry 5002 could be equivalent to controller circuitry 1002 of device 1000, for example.

In this embodiment, the amplification circuitry 5004 comprises a plurality of switchable transistors. An example of the internal configuration of the amplification circuitry 5004 is as described with reference to FIG. 4 above. However, the amplification circuitry 5004 is not particularly limited in this regard. Rather, any internal configuration of transistors may be provided within the amplification circuitry 5004, insofar as a state of connection between the plurality of switchable transistors may be changed under the control of the controller circuitry 5004 in order to change an effective physical dimension of the amplification circuitry 5004.

Furthermore, the variable voltage input 5006 is connected to the amplification circuitry 5004 of the device 5000. An example of a variable voltage input 5006 supply source is described with reference to FIG. 1 above. However, the variable voltage input supply source 5006 is not particularly limited in this regard. Rather, any such power source capable of providing a variable supply voltage to the amplification circuitry 5004 under the control of the controller circuitry 5002 may be used in accordance with embodiments of the disclosure. That is, the voltage supply source itself need not be located within the device 5000 itself, insofar as the controller circuitry 5004 of the device 5000 is able to control the input voltage supplied to the amplification circuitry 5004. According to embodiments of the disclosure, this could be achieved through the use of a voltage converter or the like external or internal to device 5000.

The controller circuitry 5002 of the device 5000 may be communicatively coupled with the amplification circuitry and/or the amplification circuitry either directly or indirectly. According to embodiments of the disclosure, the controller circuitry 5002 is configured in order to set a target output power level of the device 5000. The target output power level of the device 5000 may, in certain example situations, be set according to frequency band or mode of the input signal or distance of the UE terminal from the base station. The target output power level of the device may be set by the controller in accordance with a received instruction. Alternatively, the target output power level of the device may be set based upon a determination performed by the controller itself.

Subsequently, once the target output power level of the device 5000 has been set, the controller 5002 is configured to control at least one of a state of connection between the plurality of switchable transistors of the amplification circuitry 5004 (to change an effective physical dimension of the amplification circuitry 5004) and/or a level of the variable voltage input, in accordance with a load impedance of an output of the amplification circuitry 5004. The control is performed by the controller circuitry 5002 in order that the input signal is amplified to the target power level, for that load impedance.

In this manner, any required level of output power can be delivered into any given load impedance by varying the supply voltage of the device 5000 and/or the effective physical dimension of the amplification circuitry 5004.

Figure 6:
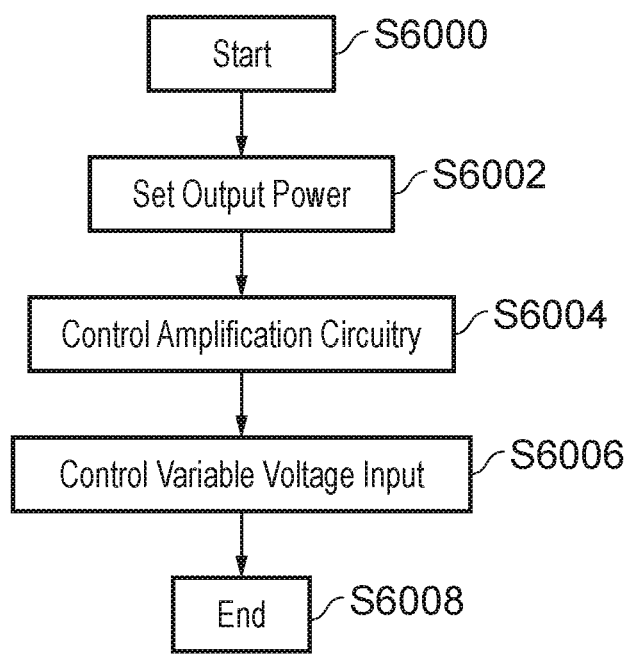
FIG. 6 shows a method of controlling a device for amplification of an input signal in accordance with embodiments of the disclosure.

Method of Amplification of Input Signal:

FIG. 6 shows a method of controlling a device for amplification of an input signal in accordance with embodiments of the disclosure. The method steps may be performed by controller circuitry 5002 of a device such as device 5000 described with reference to FIG. 5 above.

The method begins in step S6000 and proceeds to step S6002.

In step S6002, the method comprises setting a target output power level of the device. The method of setting the target output power level of the device is not particularly limited. For example, in a multi-band multi-mode transmission system such as that described with reference to FIG. 1 above, the target output power level may depend upon the frequency of the input signal itself. However, the target output power level may be determined by any appropriate method in accordance with the situation to which embodiments of the disclosure are applied. For example, the target output power level may be determined by the controller circuitry 5002 in accordance with a transmission requirement or an internal state of the device 5000. Alternatively or in addition, the target output power level of the device may be predetermined in advance and retrieved from an internal storage of device 5000 or controller 5002 or the like. Alternatively or in addition, the target output power level of the device may be set in accordance with a received instruction. In certain example situations, the target output power level may be set based on a frequency mode or band of operation and/or a distance from the transmission target (such as a basestation or the like).

Once the target output power level has been set, the method may proceed to either S6004 or S6006. That is, according to embodiments of the disclosure, the controller may be configured to perform method step S6004 and/or method step S6006.

In step S6004, the method comprises controlling a state of connection between the plurality of switchable transistors of the amplification circuitry 5004 in order to change an effective physical dimension of the amplification circuitry 5004. The manner of controlling the state of connection between the plurality of switchable transistors in accordance with embodiments of the disclosure is not particularly limited. For example, the plurality of transistors may be connected by a corresponding plurality of switches as described above with reference to FIG. 4. Alternatively, the transistors may be switchable through an alternative mechanism such as individual shorting of the transistors or the like. That is, any such mechanism may be used in accordance with embodiments of the disclosure, provided that the state of connection is controlled in accordance with a load impedance of an output of the amplification circuitry 5004, to amplify the input signal to the target output power level for that load impedance.

Once the state of connection between the plurality of switchable transistors of the amplification circuitry 5004 has been controlled as described above, the method proceeds to either step S6006 or step S6008. That is, as noted above, step S6006 and/or S6008 may be performed by the controller circuitry 5002 in accordance with embodiments of the disclosure.

In step S6008, following either step S6004 or step S6006 as described above, the method according to embodiments of the disclosure comprises determining a level of the variable voltage input in accordance with a load resistance of an output of the device 5000, required to amplify the input signal to the target output power level. It will be appreciated that the method of determining the level of the variable voltage input is not particularly limited. For example, the method described with reference to FIG. 1 of the present disclosure may be applied for use with a multi-band multi-mode transmission system.

Once the variable voltage input has been controlled, or indeed directly from step S6006, the method proceeds to, and ends with, step S6008.

Through use of the method performed by the controller 5002 of the device 5000 as described above, any required level of output power can be delivered into any given load impedance by varying the supply voltage of the device and/or the effective physical dimension of the amplification circuitry.

Computer Program Product for Amplification of Input Signal:

Furthermore, according to embodiments of the disclosure, the controller circuitry 5002 may be a microprocessor carrying out computer instructions, or may be a portion of an Application Specific Integrated Circuit. In this situation, computer instructions are stored on a storage medium which may be a magnetically readable medium, optically readable medium or solid state type circuitry. For the specific situation whereby the device 5000 is implemented in a UE or the like, the computer instructions may be incorporated as software code on the UE central baseband processor, for example. The storage medium may be integrated into the device 5000 or may be separate to the device 5000 and connected thereto using either a wired or wireless connection. The computer instructions may be embodied as computer software that contains computer readable code which, when loaded onto the controller circuitry 5002, configures the controller circuitry 5002 to perform the method according to embodiments of the disclosure described with reference to FIG. 5 above.

Obviously, numerous modifications and variations of the present disclosure are possible in light of the above teachings. It is therefore to be understood that within the scope of the appended claims, the disclosure may be practiced otherwise than as specifically described herein.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure.

It will be appreciated that the above description for clarity has described embodiments with reference to different functional units, circuitry and/or processors. However, it will be apparent that any suitable distribution of functionality between different functional units, circuitry and/or processors may be used without detracting from the embodiments.

Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognize that various features of the described embodiments may be combined in any manner suitable to implement the technique.

The invention claimed is:

1. A device for amplification of an input signal, the device comprising:
   amplification circuitry comprising a plurality of switchable transistors;
   a variable supply voltage input connected to the amplification circuitry; and
   controller circuitry configured to:
   set a target output power level of the device; and
   control at least one of: (1) a state of connection between the plurality of switchable transistors to change an effective physical dimension of the amplification circuitry, or (2) a level of the variable supply voltage input, based on a predetermined load impedance, to cause the amplification circuitry to amplify the input signal to the set target output power level for the predetermined load impedance, wherein the device further comprises a plurality of input terminals selectively connectable to the amplification circuitry, and the controller circuitry is further configured to control a state of connection between the plurality of input terminals and the amplification circuitry in accordance with an operation of the device.

2. The device according to claim 1, wherein the controller circuitry is further configured to set the target output power level in accordance with the input signal received at an input terminal of the plurality of input terminals.

3. The device according to claim 1, wherein the plurality of transistors employ III-V materials.

4. The device according to claim 1, wherein the plurality of switchable transistors are field effect transistors or heterojunction bipolar transistors.

5. The device according to claim 4, wherein the controller circuitry is further configured to control the state of connection between the plurality of field effect transistors to control an effective gate width of the amplification circuitry.

6. The device according to claim 1, wherein the device further comprises a plurality of output terminals selectively connectable to the amplification circuitry, and wherein the controller circuitry is further configured to control a state of connection between the plurality of output terminals and the amplification circuitry in accordance with the state of connection between the plurality of input terminals and the amplification circuitry.

7. The device according to claim 6, wherein the plurality of input and output terminals of the device are respectively configured for inputting and outputting signals of different radio frequencies.

8. The device according to claim 7, wherein the plurality of input terminals are configured to receive at least one of: 3G, 4G, and 5G input signals, input signals conforming to 3GPP communication standards, or input signals conforming to WiFi communication standards.

9. A device for amplification of an input signal, the device comprising:
   amplification circuitry comprising a plurality of switchable transistors;
   a variable supply voltage input connected to the amplification circuitry; and
   controller circuitry configured to:
      set a target output power level of the device; and
      control at least one of: (1) a state of connection between the plurality of switchable transistors to change an effective physical dimension of the amplification circuitry, or (2) a level of the variable supply voltage input, based on a predetermined load impedance, to cause the amplification circuitry to amplify the input signal to the set target output power level for the predetermined load impedance,
   wherein the variable supply voltage input comprises a DC power supply and a buck-boost converter.

10. The device according to claim 1, wherein the device is formed on an integrated circuit chip.

11. The device according to claim 1, wherein an output impedance of the amplification circuitry is matched to the predetermined load impedance.

12. The device according to claim 1, wherein the predetermined load impedance is 50 Ohms.

13. The device according to claim 1, wherein the device is located on the user equipment side in a wireless communication network.

14. The device according to claim 1, wherein the device is located on the base station side in a wireless communication network.

15. A method of controlling a device for amplification of an input signal, the device comprising amplification circuitry comprising a plurality of switchable transistors; a variable supply voltage input connected to the amplification circuitry; and controller circuitry, wherein the method comprises:
   setting a target output power level of the device; and
   controlling at least one of: (1) a state of connection between the plurality of switchable transistors to change an effective physical dimension of the amplification circuitry, or (2) a level of the variable supply voltage input, based on a predetermined load impedance, to cause the amplification circuitry to amplify the input signal to the set target output power level for the predetermined load impedance,
   wherein the device further comprises a plurality of input terminals selectively connectable to the amplification circuitry, and
   the method further comprises controlling a state of connection between the plurality of input terminals and the amplification circuitry in accordance with an operation of the device.

* * * * *